(12) United States Patent
Dean

(10) Patent No.: US 7,675,704 B2
(45) Date of Patent: Mar. 9, 2010

(54) MAGNETORESISTIVE HEAD PREAMPLIFIER CIRCUIT WITH PROGRAMMABLE INPUT IMPEDANCE

(75) Inventor: Douglas W. Dean, Eagan, MN (US)

(73) Assignee: Texas Instruments Incorporated, Dallas, TX (US)

( * ) Notice: Subject to any disclaimer, the term of this patent is extended or adjusted under 35 U.S.C. 154(b) by 622 days.

(21) Appl. No.: 11/460,568

(22) Filed: Jul. 27, 2006

(65) Prior Publication Data

US 2007/0211364 A1      Sep. 13, 2007

Related U.S. Application Data

(60) Provisional application No. 60/780,716, filed on Mar. 9, 2006.

(51) Int. Cl.
*G11B 5/02* (2006.01)
(52) U.S. Cl. .......................................... 360/67; 360/46
(58) Field of Classification Search ...................... None
See application file for complete search history.

(56) References Cited

U.S. PATENT DOCUMENTS

| | | | |
|---|---|---|---|
| 4,270,103 A * | 5/1981 | Schroder ..................... 333/14 |
| 6,122,127 A | 9/2000 | Flinsbaugh | |
| 6,341,046 B1 | 1/2002 | Peterson | |
| 6,420,910 B1 | 7/2002 | Contreras | |
| 2002/0070801 A1* | 6/2002 | Ferianz ........................ 330/69 |
| 2003/0234685 A1 | 12/2003 | Ranmuthu | |
| 2004/0085667 A1 | 5/2004 | Chung et al. | |
| 2005/0088203 A1 | 4/2005 | Price, Jr. | |
| 2005/0162221 A1 | 7/2005 | Barnett et al. | |
| 2005/0174669 A1 | 8/2005 | Contreras et al. | |
| 2005/0180041 A1 | 8/2005 | Kajiyama et al. | |

* cited by examiner

*Primary Examiner*—Jason C Olson
(74) *Attorney, Agent, or Firm*—Dawn V. Stephens; Wade James Brady, III; Frederick J. Telecky, Jr.

(57) ABSTRACT

A preamplifier circuit for a disk drive system is disclosed. The preamplifier circuit has first and second inputs that sense the voltage on either side of a magnetoresistive (MR) head element, which presents a varying resistance according to the localized magnetic field at a nearby disk surface. The preamplifier circuit includes a programmable input impedance circuit, which presents an impedance in parallel to feedback impedance at each of the first and second inputs. The parallel impedance presented by the programmable input impedance circuit is controlled by controlling a current source in the programmable input impedance circuit; a higher current results in a lower input impedance.

25 Claims, 2 Drawing Sheets

MAGNETORESISTIVE HEAD PREAMPLIFIER CIRCUIT WITH PROGRAMMABLE INPUT IMPEDANCE

CROSS-REFERENCE TO RELATED APPLICATIONS

This application claims priority, under 35 U.S.C. §119(e), of Provisional Application No. 60/780,716, filed Mar. 9, 2006, which is incorporated herein by this reference.

STATEMENT REGARDING FEDERALLY SPONSORED RESEARCH OR DEVELOPMENT

Not applicable.

BACKGROUND OF THE INVENTION

This invention is in the field of amplifiers, and is more specifically directed to preamplifiers for magnetoresistive heads as used in a disk drive system.

Continuing progress toward higher performance yet less expensive personal computers, including both desktop workstations and portable computers, has resulted in large part from advances in nonvolatile data storage technology. As is well known in the art, the capacity of conventional disk drives has greatly increased over recent years, at ever decreasing cost per megabit. This capacity increase is directly related to improvements in the density with which data can be stored in a magnetic disk drive, particularly in "hard" disk drives (i.e., disk drives in which the magnetic disk is not removable from the location of the read/write heads).

In conventional magnetic disk drives, the writing and reading of stored data is carried out by way of near-field magnetic processes. To write data, ferromagnetic domains at the disk surface are selectively oriented by applying a magnetic field in close proximity to the disk surface. One type of conventional write head is the well-known inductive writer, which includes an electromagnet having a gap that can be positioned near the magnetic disk surface. The electromagnet is selectively energized to establish a magnetic field, at the gap, that is strong enough to define a magnetic "transition pattern" of the desired polarity at the addressed location of the disk surface. Data is read from the disk by sensing the polarity of the magnetic field established by these magnetic transition patterns. Conventional read heads include inductive heads consisting of an electromagnet (which may be the same electromagnet used to write data) in which a current is induced by the magnetic fields at the disk surface; more recently, read heads are implemented by a magnetoresistive (MR) head having a resistance that varies with the polarity of the magnetic field.

As is fundamental in the art, MR heads are biased to a steady-state operating point, so that the variations in the resistance of the MR head, due to the data-dependent varying magnetic field as the head travels along the disk surface, appear as small signal variations on this steady-state operation. These small signal variations are amplified by a preamplifier, and with the amplified signals forwarded along the data channel of the disk drive system. An example of a bias circuit for an MR head in a modern disk drive system is described in my copending and commonly assigned U.S. patent application Ser. No. 11/344,037, filed Jan. 31, 2006, and entitled "Bias Circuit for a Magnetoresistive Preamplifier Circuit".

FIG. 1 illustrates an example of a conventional preamplifier circuit as used in modern disk drive systems. Preamplifier 2 of FIG. 1 corresponds to the first amplification stage in the disk drive preamplifier, and as such has inputs HEADP, HEADN for receiving the voltage across the MR read head. In conventional preamplifier 2, DC offset voltage across inputs HEADP, HEADN is removed by cross-coupled differential transistor pairs. More specifically, input HEADP is connected to the base of npn transistor 2a, which has its collector coupled through resistor R1 to the $V_{cc}$ power supply. Input HEADP is also capacitively coupled, via capacitor C1b, to the base of npn transistor 3b in another differential transistor pair; transistor 3b has its collector biased to the $V_{cc}$ power supply via resistor R4. Conversely, input HEADN is connected to the base of npn transistor 3a, which has its collector biased to $V_{cc}$ through resistor R3. The emitters of transistors 3a, 3b are connected together and to the $V_{ee}$ power supply via current source 7, which sources a current ITAIL. Similarly, input HEADN is capacitively coupled to the base of npn transistor 2b, which has its collector biased to $V_{cc}$ via resistor R2. The emitters of transistors 2a, 2b are connected in common, and to the $V_{ee}$ power supply via current source 6, which also sources current ITAIL. Transconductance (gm) stage 5a receives the voltage at the collector of transistor 2a, at a negative input, and drives a current into the base of transistor 2b corresponding to the difference between this collector voltage and a reference voltage REF. Similarly, gm stage 5b receives a voltage from the collector of transistor 3a at an inverting input, and compares that voltage with reference voltage REF to produce a bias current into the base of transistor 3b.

In operation, gm stages 5a, 5b block the DC bias voltage at the MR head, which of course is applied to inputs HEADP, HEADN, from being reflected at the output of preamplifier 2. For example, if the voltage at input HEADP has a relatively high DC steady state value, that voltage will tend to turn transistor 2a on relatively hard, which pulls the voltage at the collector of transistor 2a lower because of the voltage drop across resistor R1. This DC level is compensated by gm stage 5a which, in response to the relatively low voltage at the collector of transistor 2a as applied to its inverting input, will source more current into the base of transistor 2b; because the sum of the emitter currents of transistors 2a, 2b are fixed to current ITAIL by current source 6, this higher bias current into the base of transistor 2b will reduce the current through transistor 2a, permitting its collector voltage to rise back to a stable level (determined by reference voltage REF). Similar operation is provided by gm stage 5b, in blocking the DC levels at input HEADN from affecting circuit operation.

Conventional preamplifier 2 of FIG. 1 provides a differential output stage at its outputs OUTP, OUTN. Output OUTP is taken at the emitter of transistor 4a, which has its base connected to the collector of transistor 2a, and its collector biased directly to the $V_{cc}$ power supply, in emitter follower fashion. Resistor R5 connects the emitter of transistor 4a to input HEADP, and through current source 8a to the $V_{ee}$ power supply. Similarly, transistor 4b has its collector biased directly to $V_{cc}$, and its emitter connected to input HEADN via resistor R6; this emitter node is also biased to the $V_{ee}$ power supply via current source 8b. Output OUTN is taken from the emitter of transistor 4b, in emitter follower fashion. Outputs OUTP, OUTN are forwarded to the next gain stage in the disk drive preamplifier.

According to this construction, the signal at inputs HEADP, HEADN is amplified at the collector of transistors 2a, 2b, respectively, and output to nodes OUTP, OUTN via the emitter followers of transistor 4a, 4b, respectively. On each side of this circuit, a feedback loop is provided by the operation of resistor R1 through transistor 4a (for input HEADP) and by operation of resistor R3 through transistor 4b (for input HEADN). In effect, the amplifier and feedback portions of this preamplifier circuit can be considered as an inverting amplifier with a resistor (R5, R6) from the output back to the input. Those skilled in the art will therefore readily derive the input impedance $Z_{in}$ as:

$$Z_{in} = \frac{R_f}{k+1}$$

where $R_f$ is the resistance of the corresponding resistor R5, R6, and where k is the gain of the amplifier established by transistor 2a, 2b and corresponding collector resistor R1, R3, respectively. In conventional preamplifier circuits for disk drive systems, this input impedance $Z_{in}$ is typically matched to the impedance of the transmission line of the connection between the MR head and input nodes HEADP, HEADN. This input impedance $Z_{in}$ is typically determined by design and characterization.

It has been observed, in connection with this invention, that the use of a fixed input impedance $Z_{in}$ is not optimal in many disk drive applications, however. For example, the same preamplifier integrated circuit may be used over a wide range of system applications, with different conductor lengths and characteristics possible, depending on the system application. These differing system realizations can easily result in the transmission line impedance, between the MR head and the preamplifier, not matching the input impedance of the preamplifier circuit itself. This mismatch will of course result in reflections and other degradation of the signal from the MR head, which can lead to read errors and poor performance. In addition, it has been observed, in connection with this invention, that this input impedance can be somewhat frequency dependent. As such, variations in the signal frequency from the MR head may not be accurately sensed by the preamplifier, at those frequencies with mismatched input impedance.

BRIEF SUMMARY OF THE INVENTION

It is therefore an object of this invention to provide a preamplifier circuit and method of operating the same that is capable of operation in a wide range of system applications.

It is a further object of this invention to provide such a circuit and method in which the input impedance can be optimized for a particular system application.

It is a further object of this invention to provide such a circuit and method in which the preamplifier performance can be optimized during operation.

Other objects and advantages of this invention will be apparent to those of ordinary skill in the art having reference to the following specification together with its drawings.

The present invention may be implemented into a disk drive preamplifier circuit, in which an additional feedback path is provided. This additional feedback path is provided in the form of a differential transconductance (gm) circuit, including a differential transistor pair with emitters in common and controlled by controllable current sources. By setting the current levels of the current sources, the transconductance of the differential pair can be set; this transconductance is effectively in parallel with the feedback resistors at the input of the preamplifier. Control of the input impedance to the preamplifier can therefore be programmed and adjusted.

DETAILED DESCRIPTION OF THE INVENTION

The present invention will be described in connection with its preferred embodiment, namely as implemented into a magnetic disk drive system. However, it is also contemplated that the advantages of the bias circuit arrangement described herein may also be of benefit in other applications and uses. Accordingly, it is to be understood that the following description is provided by way of example only, and is not intended to limit the true scope of this invention as claimed.

Figure 2:
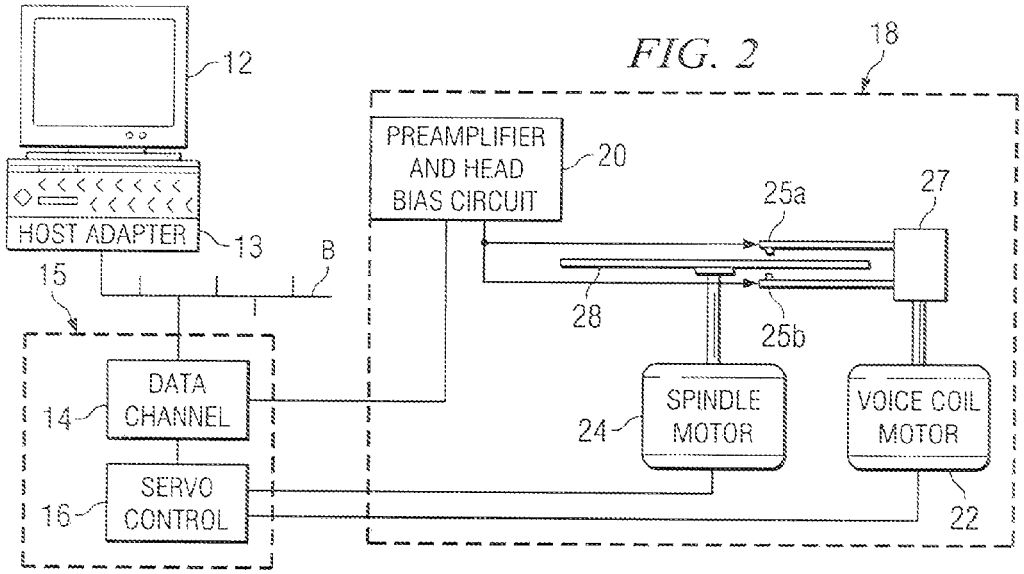
FIG. 2 is an electrical diagram, in block form, of a disk drive system constructed according to the preferred embodiment of the invention.

FIG. 2 illustrates an exemplary example of a computer system into which the preferred embodiment of the invention is implemented. In this example, personal computer or workstation 12 is realized in the conventional manner, including the appropriate central processing unit (CPU), random access memory (RAM), video and sound cards or functionality, network interface capability, and the like. Also contained within computer 12 is host adapter 13, which connects on one side to the system bus of computer 12, and on the other side to bus B, to which disk drive controller 15 is connected. Bus B is preferably implemented according to conventional standards, examples of which include the Enhanced Integrated Drive Electronics (EIDE) standard, the Small Computer System Interface (SCSI) standard, or the Serial Advanced Technology Attachment (SATA) standard. Other disk storage devices (hard disk controllers, floppy drive controllers, etc.) and other peripherals may also be connected to bus B, as desired and in the conventional manner.

Those skilled in the art will readily realize that the system of FIG. 2 may alternatively apply to other system applications and architectures. For example, many portable audio players, digital video recorders, and other common systems use disk drive storage, and as such include functionality such as preamplifier 20, servo control 16, data channel 14, and the like within the confines of a small system such as a digital audio player. Other uses and applications of disk drives are also known in the art. Accordingly, while FIG. 2 illustrates the system application of the invention in connection with a computer system, that system application is only one of a wide range of systems that can utilize the invention, and as such is presented by way of an example only.

Controller 15 is a conventional disk drive controller as known in the art. In modern disk drives in which the drive electronics is implemented at the disk drive rather than as a controller within computer 12 itself, controller 15 is implemented in a printed circuit board within the disk drive itself. Of course, in larger scale systems, controller 15 may be implemented within computer 12. In the generalized block diagram of FIG. 2, the components of controller 15 are shown according to their functions, rather than their physical integrated circuits, for the sake of clarity. Typical integrated circuits used to implement disk drive controllers such as controller 15 include a digital signal processor (DSP), read-only memory (ROM) and random access memory (RAM), other non-volatile storage such as flash RAM, interface circuitry connected to bus B, and other custom logic circuitry. Functionally, controller 15 includes data channel 14, which is interfaced with bus B to communicate data to and from preamplifier and head bias circuit 20 at head-disk assembly 18. Data channel 14 is also in communication with servo controller 16, which drives voice coil motor 22 and spindle motor 24 in head-disk assembly 18.

Head-disk assembly 18 includes the electronic and mechanical components that are involved in the writing and reading of magnetically stored data. In this example, head-disk assembly 18 includes one or more disks 28 having ferromagnetic surfaces (preferably on both sides) that spin about their axis under the control of spindle motor 24. Multiple read/write head assemblies 25a, 25b are movable by actuator 27. Accordingly, signals from servo control function 16 in controller 15 control spindle motor 24 and voice coil motor 22 so that actuator 27 places the read/write head assemblies 25a, 25b at the desired locations of disk surface 28 to write or read the desired data.

According to the preferred embodiment of the invention, read/write head assemblies 25 include magnetoresistive (MR) heads, particularly as used in the sensing of the polarity (and, perhaps, magnitude) of the magnetic domains at the desired locations of disk surface 28, thus "reading" the stored digital data corresponding to the magnetic patterns. As fundamental in the art, MR sensing is based on changes in the electrical resistance of certain magnetic materials in response to external magnetic fields. Such sensing requires steady-state biasing of the MR element, as the MR read head, so that the variations in resistance appear as small signal variations on a steady-state bias level.

Figure 3:
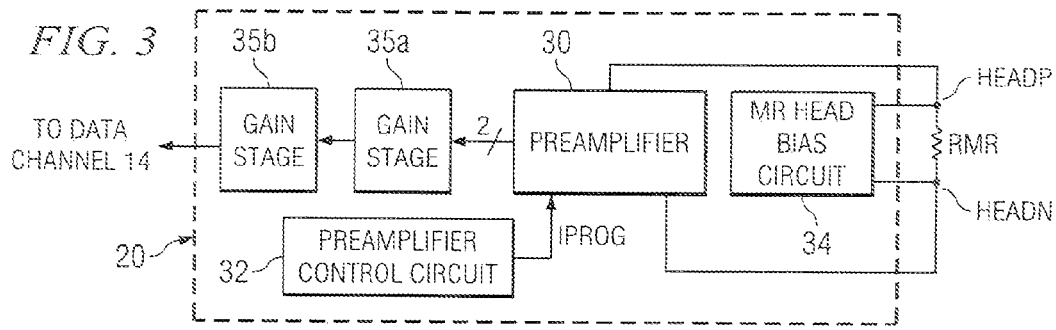
FIG. 3 is an electrical diagram, in block form, of the preamplifier and bias circuit of the disk drive system of FIG. 2, constructed according to the preferred embodiment of the invention.

Accordingly, as shown in FIG. 3, resistor RMR represents the magnetoresistive (MR) head, and thus variations in the resistance of resistor RMR are representative of magnetic data stored on the disk surface. Preamplifier and head bias circuit 20 includes bias circuit 34, which applies a steady-state bias across resistor RMR; an example of a bias circuit 34, suitable for use in this preferred embodiment of the invention, is described in my copending and commonly assigned U.S. patent application Ser. No. 11/344,037, filed Jan. 31, 2006, and entitled "Bias Circuit for a Magnetoresistive Preamplifier Circuit". Preamplifier 30 senses variations in the voltage across resistor RMR (or, alternatively, variations in the current conducted by resistor RMR), and as such is connected to nodes HEADP, HEADN. Preamplifier 30 amplifies these small signal variations in resistor RMR, and forwards the amplified signal to one or more gain stages 35a, 35b, for eventual communication to data channel 14 (FIG. 2) for handling.

According to the preferred embodiment of the invention, preamplifier and head bias circuit 20 also includes preamplifier control circuit 32. According to this embodiment of the invention, preamplifier control circuit 32 issues signals (either analog or digital) that control or modulate the input impedance presented by preamplifier 30 to sense nodes HEADP, HEADN, as will be described in further detail below. In this example, preamplifier control circuit 32 presents control signal IPROG, which will control one or more current sources within preamplifier 30 as will be described in further detail below. This control signal IPROG may be an analog signal (i.e., a variable current), or alternatively may be a digital value, depending on the construction of current sources within preamplifier 30 as will be apparent from the following description. In any event, it is contemplated that preamplifier control circuit 32 may be itself programmable, either in a hard-wired sense by way of trimming or setting fusible links, or in a "soft" sense in response to register settings, commands, or other signals from elsewhere within the disk drive system. It is further contemplated that those skilled in the art having reference to this specification will be readily able to define and implement such control functions.

As evident from FIG. 3, and as mentioned above, preamplifier 30 is connected to resistor RMR as the magnetoresistive (MR) head, and as such has inputs HEADP, HEADN for receiving the voltage at respective sides of resistor RMR. Preamplifier 30 issues a differential output to gain stage 35a, corresponding to an amplified version of small signal variations of the voltage across resistor RMR.

Figure 4:
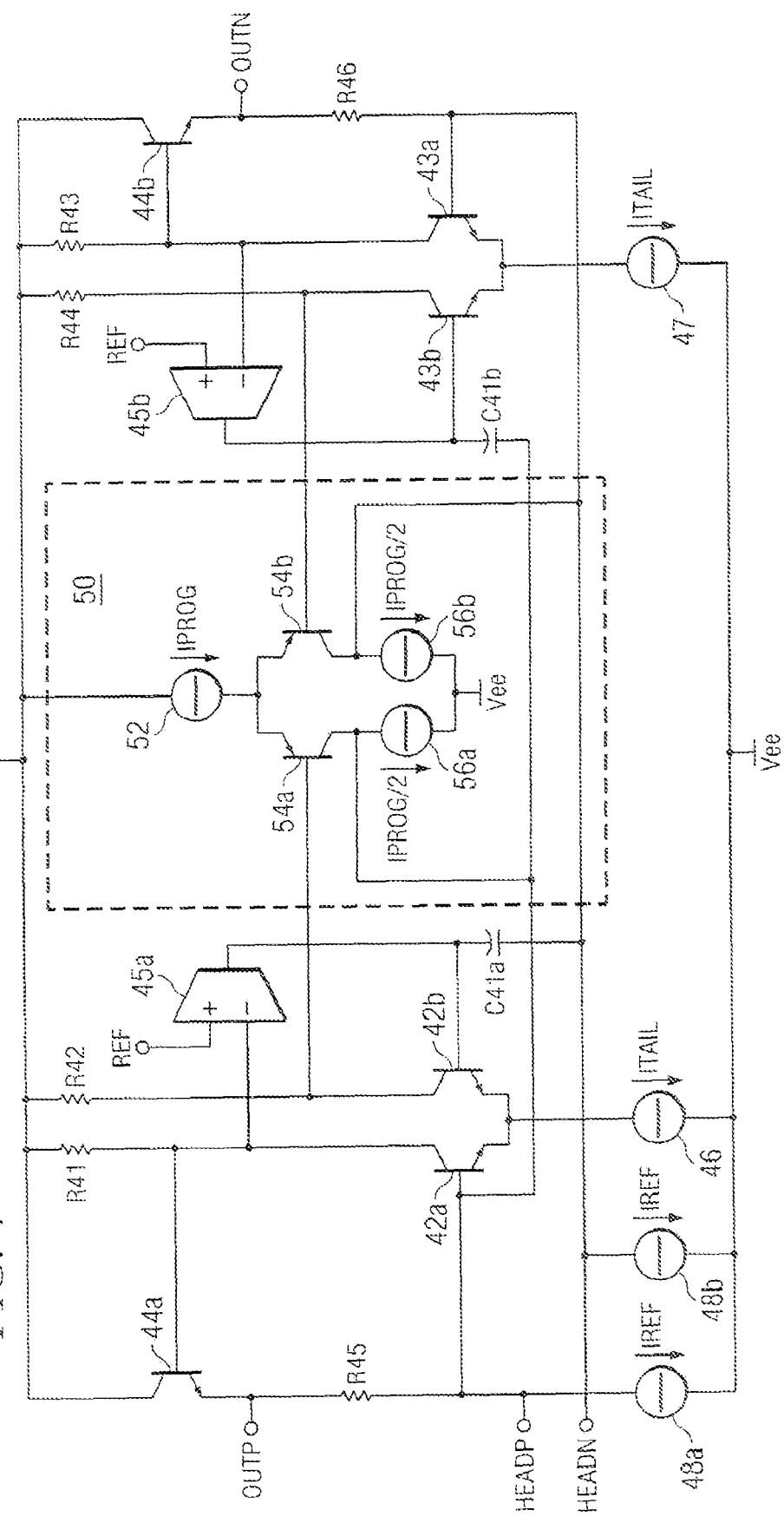
FIG. 4 is an electrical diagram, in schematic form, of a preamplifier constructed according to the preferred embodiment of the invention.

FIG. 4 illustrates the construction of preamplifier 30 according to the preferred embodiment of the invention. According to this preferred embodiment of the invention, preamplifier 30 is constructed somewhat similarly as preamplifier 2 described above. However, according to this preffered embodiment of the invention, programmable impedance circuit 50 is included within preamplifier 30, for adjusting and controlling the input impedance presented by preamplifier 30 to the signal at resistor RMR. The construction and operation of programmable impedance circuit 50 will be described below in detail, following a description of the amplifier portions of preamplifier 30.

Inputs HEADP, HEADN from resistor RMR are received at the base of npn transistors 42a, 43a, respectively, in preamplifier 30. More specifically, input HEADP is connected to the base of npn transistor 42a, which has its collector coupled through resistor R41 to the $V_{cc}$ power supply. The emitter of transistor 42a is connected to the emitter of paired npn transistor 42b, and via current source 46 to the $V_{ee}$ power supply. In this arrangement, transistor 42a and resistor R41 serve as an amplifier to the signal at input HEADP; the output of this amplifier, at the collector of transistor 42a, is applied to the base of emitter follower npn transistor 44a, which has its emitter coupled to $V_{ee}$ via resistor R45 and current source 48a. A first output from preamplifier 30 to gain stage 35a, at node OUTP (FIG. 3), is driven by the emitter of transistor 44a. Input HEADP, and thus the base of transistor 42a, is connected to the node between resistor R45 and current source 48a. As such, the state of output node OUTP is fed back to input HEADP via resistor R45.

Similarly, input HEADN is connected to the base of npn transistor 43a, which has its collector connected to power supply $V_{cc}$ via resistor R43. The emitter of transistor 43a is connected in common with the emitter of its paired transistor 43b, and coupled to the $V_{ee}$ power supply via current source 47. The output of the amplifier formed by transistor 43a and resistor R43 is applied to the base of emitter follower npn transistor 44b, which has its collector at the $V_{cc}$ power supply, and its emitter driving output node OUTN. Feedback resistor R46 is connected between the emitter of transistor 44b and input node HEADN, and is biased via current source 48b to the $V_{ee}$ power supply. The currents sourced by current sources 48a, 48b are preferably identical and are set to a desired level IREF, based on the desired amplification characteristics and head biasing specifications. Similarly, the currents ITAIL sourced by current sources 46, 47 are also preferably identical to one another, and are set to a level that is suitable for the desired amplification and response of the circuit.

As in preamplifier 2 described above relative to FIG. 1, preamplifier 30 according to this embodiment of the invention is arranged as cross-coupled differential pairs, to block DC offset voltage at resistor RMR from being passed along to gain stage 35a. As evident from FIG. 3, resistor RMR is biased by MR head bias circuit 34, and as such inputs HEADP, HEADN necessarily have a steady-state DC voltage about which variations in the resistance, caused by variations in the magnetic field corresponding to the data written to disk 28, are reflected as small signal variations on the DC biased levels. As well-known in the art, the DC levels themselves are of no interest in the reading of data from disk 28, and are thus preferably blocked from amplification.

On the HEADP input side, npn transistor 42b has its collector coupled to the $V_{cc}$ power supply via resistor R42; its emitter is biased by current source 46 as noted above. The base of transistor 42b is driven by the output of gm stage 45a, which receives the amplifier node at the collector of transistor 42a at an inverting input, and a reference voltage REF at its non-inverting input. The base of transistor 42b is also coupled to the other input HEADN, via capacitor C41a. In operation, gm stage 45a drives a current corresponding to the difference between the amplified voltage at the collector of transistor 42a and reference voltage REF, and applies this current to the base of transistor 42b. For example, if the DC steady-state voltage at node HEADP is relatively low, the voltage at the collector will be relatively high, due to relatively little current being conducted through transistor 42a and resistor R41. This situation will cause gm stage 45a to source a lower current into the base of transistor 42b, such that more of the current ITAIL controlled by current source 46 will be conducted by transistor 42a rather than 42b, which will pull the voltage at the collector of transistor 42a lower. Regardless of the actual DC voltage at node HEADP at resistor RMR, therefore, the DC voltage at the collector of transistor 42a will remain relatively stable. The response of this circuit will depend on the current ITAIL sourced by current source 46. In addition, capacitor C41a, which is connected to node HEADN and the base of transistor 42b, in conjunction with gm stage 45a, will shape the frequency response such that small signal variations in the voltage across resistor RMR will be amplified, while variations in the DC voltage of both nodes (i.e., with a constant voltage across resistor RMR) will be suppressed from appearing at the output of preamplifier 30.

Similarly, on the input HEADN side, the collector of transistor 43a is connected to the inverting input of gm stage 45b, which receives reference voltage REF at its non-inverting input. The output of gm stage 45b is applied to the base of transistor 43b, which has its emitter in common with transistor 43a and its collector biased to the $V_{cc}$ power supply via resistor R44. Input HEADP is capacitively coupled to the base of transistor 43b, also. The operation of gm stage 45b in maintaining a relatively constant DC bias point for the amplifier node at the collector of transistor 43a is similar as that described above for gm stage 45a.

Figure 1:
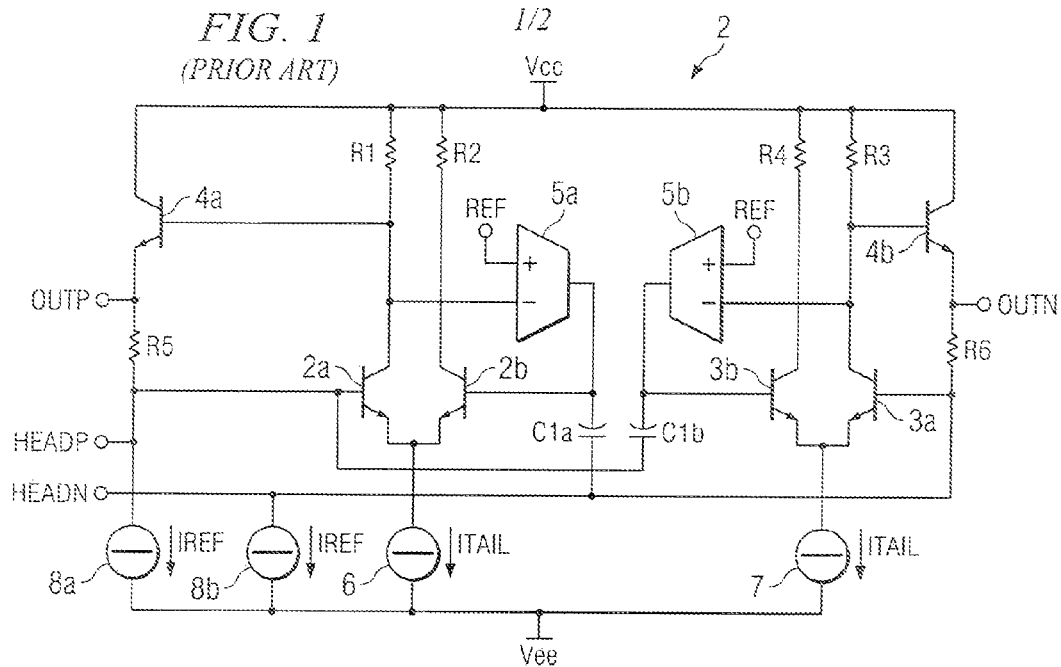
FIG. 1 is an electrical diagram, in schematic form, of a conventional preamplifier for a magnetoresistive (MR) head for a disk drive.

According to this construction, as in the case of preamplifier 2 of FIG. 1, preamplifier 30 provides a differential output signal at its outputs OUTP, OUTN that corresponds to small signal variations in the voltage across resistor RMR, as reflected at inputs HEADP, HEADN. As before, output OUTP is taken at the emitter of transistor 44a, and output OUTN is taken from the emitter of transistor 44b, both devices arranged in emitter follower fashion. Outputs OUTP, OUTN are forwarded to gain stage 35a in the disk drive preamplifier 20, as shown in FIG. 3.

According to the preferred embodiment of this invention, programmable impedance circuit 50 adjusts and programmably controls the input impedance presented by preamplifier 30 at its input HEADP, HEADN. In the example of FIG. 4, programmable impedance circuit 50 includes a pair of pnp transistors 54a, 54b. The emitters of transistors 54a, 54b are connected in common, and this common emitter node is biased from the $V_{cc}$ power supply via controllable current source 52. The collector of transistor 54a is connected to the $V_{ee}$ power supply via current source 56a, and the collector of transistor 54a is connected to the $V_{ee}$ power supply via current source 56b. Current sources 56a, 56b are preferably constructed identically, and controlled in common with one another, so that the collector currents of transistors 54a, 54b are equal to one another. In addition, current sources 56a, 56b are preferably slaved to, or controlled along with, current source 52, so that each of current sources 56a, 56b conduct about one-half of the current conducted by current source 52. In this example, current source 52 conducts a selectable current IPROG, and each of current sources 56a, 56b conducts a current IPROG/2.

Current sources 52, 56a, 56b are preferably constructed in the conventional manner, according to the technology with which preamplifier 30 is realized. If preamplifier 30 is realized in bipolar technology, as shown in FIG. 4, current sources 52, 56a, 56b may be readily realized in the conventional manner for a bipolar current source (i.e., as a current-controlled-current-source). If metal-oxide-semiconductor (MOS) devices are available for preamplifier 30, current sources 52, 56a, 56b may be readily realized as MOS transistor current sources (i.e., as voltage-controlled-current-sources). Other conventional realizations of current sources 52, 56a, 56b may alternatively be used. In any event, according to this embodiment of the invention and as will be apparent from the following description, the currents conducted by current sources 52, 56a, 56b are preferably controllable by an analog or digital signal from preamplifier control circuit 32 (FIG. 3) to set the current levels of currents IPROG and IPROG/2. As will be described below, this programmable current level is reflected in the input impedance presented to inputs HEADP, HEADN.

Referring back to FIG. 4, the base of transistor 54a is connected to the collector of transistor 42b, and the base of transistor 54b is connected to the collector of transistor 43b. The collector of transistor 54a is connected to input HEADP, while the collector of transistor 54b is connected to input HEADN. As such, voltages at the differential pair amplifiers on each side of preamplifier 30 cause changes in the current conducted by transistors 54a, 54b. For example, as the small-signal collector voltage at transistor 42b falls in response to a relatively low voltage at input HEADP (which, in turn, reduces the conduction through transistor 42a and thus increases the conduction through transistor 42b), transistor 54a will be turned on harder, such that the collector current of transistor 54a increases beyond current IPROG/2 conducted by current source 56a. Any excess current beyond IPROG/2 is applied to the base of transistor 42a, effectively feeding back the result of the amplifier to input HEADP. This excess current increases the current drawn into the base of the input device in response to a given change in voltage at input HEADP, which corresponds to a reduction in the input impedance. The extent of this effect depends on the level of current IPROG (and current IPROG/2, of course) applied to programmable input impedance circuit 50. A similar operation will take place by the action of transistor 54b. A higher level of current IPROG will cause transistors 54a, 54b to be turned on harder for a given base current, generating additional excess current that feeds back to the input nodes. In effect, programmable input impedance circuit 50 provides a parallel feedback path from the amplifier output (or, more accurately, a signal corresponding to the amplifier output), in parallel with the feedback from the emitter follower output stage itself. This feedback is in the nature of a transconductance feedback, in that an output current to each of inputs HEADP, HEADN is produced in response to a voltage, specifically in the amplifier stage associated with each of those inputs.

The skilled reader can readily derive the input impedance of preamplifier 30 according to this preferred embodiment of the invention as:

$$Z_{in} = \frac{R_f}{(R_f g_m m + k + 1)}$$

where $R_f$ is the resistance of the feedback resistor R41, R43, where m is the gain from inputs HEADP, HEADN to the nodes at the collectors of transistors 42b, 43b (i.e., the inputs to the bases of transistors 54a, 54b, respectively), and where k is the gain from inputs HEADP, HEADN to the amplifier nodes at the collectors of transistors 42a, 43a. The gain k corresponds to the amplification gain of preamplifier 30; the gain m can be modified according to the desired range of programmability of programmable input impedance circuit 50, and for dynamic range considerations. The transconductance gm in this expression of input impedance $Z_{in}$ is controlled by the current IPROG conducted by current source 52 (and current sources 56a, 56b). As current IPROG increases, the transconductance $g_m$ of programmable input impedance circuit 50 will increase, which in turn decreases the input impedance $Z_{in}$. Conversely, as current IPROG decreases, the transconductance $g_m$ of programmable input impedance circuit 50 will decrease, which in turn will increase the input impedance $Z_{in}$. Indeed, if current IPROG is set to zero, input impedance $Z_{in}$ becomes:

$$Z_{in} = \frac{R_f}{k+1}$$

i.e., the conventional preamplifier circuit described above relative to FIG. 1.

As a result of programmable input impedance circuit 50, therefore, the input impedance $Z_{in}$ can be programmed, or adjusted, according to the system application. For example, if the transmission line of the conductor between resistor RMR and preamplifier 30 present a relatively high characteristic impedance, the current IPROG can be held relatively low, if not zero, so that the input impedance to preamplifier 30 can be matched to the transmission line impedance. Conversely, if the transmission line of that conductive path has a low impedance, current IPROG can be set to a higher level to reduce the input impedance of preamplifier 30. Furthermore, characterization of preamplifier 30 may determine frequency-dependent variations in its input impedance; as such, current IPROG can be set so that the input impedance presented by preamplifier 30 can match that of the transmission line conductor from resistor RMR at frequencies corresponding to the expected signal frequency.

It is contemplated that the construction and operation of preamplifier control circuit 32 in setting current IPROG can be readily derived by the skilled reader having reference to this specification. Various examples of this control arrangement are contemplated. For example, preamplifier control circuit 32 may contain a register, or receive a digital signal corresponding to a register elsewhere in the system, into which the system implementer can write or set the value of a register word corresponding to the desired current IPROG. This register-based, or programmable, current selection can also permit adjustment of current IPROG during use of preamplifier 30, for example in a manufacturing test or setup environment for the disk drive system. Alternatively, jumpers, fuses, or programmable non-volatile memory cells can be implemented into preamplifier and head bias circuit 20, by way of which current IPROG can be set during manufacture of the disk drive system. In addition, the signal IPROG forwarded from preamplifier control circuit 32 to preamplifier 30 can be an analog level, in which case the signal can be applied directly to current sources 52, 56a, 56b; alternatively, preamplifier control circuit 32 can provide a digital word value to preamplifier 30, in which case digital-to-analog converter circuitry (not shown) within preamplifier 30 can translate the control word to the desired bias level. Further in the alternative, preamplifier 30 can include a number of controllable and switchable shunt paths, for example in a voltage or current divider arrangement, by way of which a digital control word can establish the desired current IPROG. It is contemplated that these and other approaches to control of the current IPROG, and thus the setting or programming of the input impedance of preamplifier 30, will be suitable for use in connection with this invention, depending on the desired system implementation.

Various other alternative realizations of this invention will also be apparent to those skilled in the art having reference to this specification. For example, while bipolar junction transistors are shown in the Figures and described in this specification, MOS transistors may alternatively be used to realize the circuitry of this invention. Furthermore, the conductivity type (npn versus pnp; p-channel MOS versus n-channel MOS) of the various active devices may, of course, be selected and used in combination with the appropriate bias voltages to realize the circuit, system, and method of this invention.

This invention provides important advantages in the operation of preamplifier circuits, and particularly preamplifier circuits as used in connection with magnetoresistive heads in disk drive systems. According to this invention, the input impedance presented by the preamplifier circuit can be controlled to match that of the elements providing the signal to the preamplifier, and to match the transmission line characteristics of the connection over which the signal travels to the preamplifier. Proper matching of the input impedance thus reduces reflections and other distortions in the signal being sensed and amplified, improving the fidelity of the amplified signal and also improving the sensitivity of the preamplifier to the read signal, thus enabling higher density disk drives.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A preamplifier circuit, comprising:
   a first amplifier stage, receiving a first input and having an amplifier output;
   a first output stage, coupled to the amplifier output, for presenting a signal at a first preamplifier output corresponding to the amplifier output;

a first feedback element, coupled between the first output stage and the first input and operative for varying a preamplifier input impedance associated with the first input; and a programmable input impedance circuit, comprising:
  a main controllable current source for conducting a controllable current;
  a first transistor having a control terminal coupled to the first amplifier stage, and having a conduction path connected between the main controllable current source and a reference voltage level, and coupled on one side to the first input.

2. The preamplifier circuit of claim 1, further comprising:
  a second amplifier stage, receiving a second input and having an amplifier output;
  a second output stage, coupled to the amplifier output of the second amplifier stage, for presenting a signal at a second preamplifier output corresponding to the amplifier output of the second amplifier stage; and
  a second feedback element, coupled between the second output stage and the second input;
  and wherein the programmable input impedance circuit further comprises:
    a second transistor having a control terminal coupled to the second amplifier stage, and having a conduction path connected between the main controllable current source and a reference voltage level, and coupled on one side to the second input.

3. The preamplifier circuit of claim 2, wherein the programmable input impedance circuit further comprises:
  first and second current sources, the first current source connected in series with the conduction path of the first transistor and for conducting a current corresponding to the controllable current, and the second current source connected in series with the conduction path of the second transistor and for conducting a current corresponding to the controllable current.

4. The preamplifier circuit of claim 2, wherein the first amplifier stage comprises:
  a first amplifier transistor having a control terminal coupled to the first input, and having a conduction path;
  a first load, connected in series with the conduction path of the first amplifier transistor;
  a second amplifier transistor having a control terminal coupled to the second input, and having a conduction path;
  a second load, connected in series with the conduction path of the second amplifier transistor;
  a first tail current source, coupled to commonly connected first ends of the conduction paths of the first and second amplifier transistors, for conducting a fixed current; and
  a first gm stage, having an input coupled to the amplifier output of the first amplifier stage, and having an output coupled to the control terminal of the second amplifier transistor;
  wherein the amplifier output of the first amplifier stage is at a node between the first load and the first amplifier transistor.

5. The preamplifier circuit of claim 4, wherein the control terminal of the first transistor of the programmable input impedance circuit is coupled to a node between the second load and the second amplifier transistor.

6. The preamplifier circuit of claim 4, wherein the second amplifier stage comprises:
  a third amplifier transistor having a control terminal coupled to the second input, and having a conduction path;
  a third load, connected in series with the conduction path of the third amplifier transistor;
  a fourth amplifier transistor having a control terminal coupled to the second input, and having a conduction path
  a fourth load, connected in series with the conduction path of the fourth amplifier transistor;
  a second tail current source, coupled to commonly connected first ends of the conduction paths of the third and fourth amplifier transistors, for conducting a fixed current; and
  a second gm stage, having an input coupled to the amplifier output of the second amplifier stage, and having an output coupled to the control terminal of the fourth amplifier transistor;
  wherein the amplifier output of the second amplifier stage is at a node between the third load and the third amplifier transistor;
  and wherein the control terminal of the second transistor of the programmable input impedance circuit is coupled to a node between the fourth load and the fourth amplifier transistor.

7. The preamplifier circuit of claim 1, wherein the first output stage comprises:
  a first output transistor, having a control terminal coupled to the amplifier output of the first amplifier stage, and having a conduction path; and
  a first reference current source connected in series with the conduction path of the first output transistor;
  and wherein the first feedback element comprises:
  a first feedback resistor connected on one side to the conduction path of the first output transistor at the first preamplifier output, and on another side to the first input.

8. The preamplifier circuit of claim 7, wherein the second output stage comprises:
  a second output transistor, having a control terminal coupled to the amplifier output of the second amplifier stage, and having a conduction path; and
  a second reference current source connected in series with the conduction path of the second output transistor;
  and wherein the second feedback element comprises:
  a second feedback resistor connected on one side to the conduction path of the second output transistor at the second preamplifier output, and on another side to the second input.

9. The preamplifier circuit of claim 8, wherein the first and second output transistors are each bipolar transistors biased as emitter followers.

10. The preamplifier circuit of claim 1, further comprising:
  a preamplifier control circuit for controlling the controllable current conducted by the main controllable current source of the programmable input impedance circuit.

11. The preamplifier circuit of claim 10, further comprising:
  a resistive read head element, coupled to the first and second inputs.

12. The preamplifier circuit of claim 11, wherein the resistive read head element comprises a magnetoresistive element; and further comprising:
  a head bias circuit for applying a DC bias to the magnetoresistive element.

13. A method of operating a preamplifier circuit in a disk drive system, comprising:
  receiving, at first and second preamplifier inputs, first and second input voltages from across a resistive head element;

amplifying the first and second input voltages with first and second amplifier stages;

applying feedback from the first and second amplifier stages to the first and second inputs, respectively for varying a preamplifier input impedance, via corresponding feedback resistors; and applying a control signal to a main current source in a programmable input impedance circuit, the programmable input impedance circuit having inputs coupled to the first and second amplifier stages, and having outputs coupled to the first and second inputs, the control signal determining the effect of the programmable input impedance circuit at the first and second inputs.

14. The method of claim 13, wherein the first and second amplifier stages each comprise a differential transistor pair;

wherein the first input is applied to a base of a first amplifier transistor in the first amplifier stage, and the second input is applied to a base of a first amplifier transistor in the second amplifier stage;

and further comprising:

sourcing current from the programmable input impedance circuit into the base of the first amplifier transistor of the first amplifier stage responsive to an operating state of the first amplifier stage; and sourcing current from the programmable input impedance circuit into the base of the first amplifier transistor of the second amplifier stage responsive to an operating state of the second amplifier stage.

15. The method of claim 13, further comprising:
adjusting the control signal.

16. A disk drive system, comprising:
a magnetic disk having a surface;
a resistive read head element disposed near the surface of the magnetic disk;
a preamplifier, comprising:
  a first amplifier stage, having a first input coupled to the resistive read head element, and having an amplifier output;
  a first output stage, coupled to the amplifier output, for presenting a signal at a first preamplifier output corresponding to the amplifier output;
  a first feedback element, coupled between the first output stage and the first input and operative for varying a preamplifier input impedance associated with the first input; and
  a programmable input impedance circuit, comprising:
    a main controllable current source for conducting a controllable current;
    a first transistor having a control terminal coupled to the first amplifier stage, and having a conduction path connected between the main controllable current source and a reference voltage level, and coupled on one side to the first input.

17. The disk drive system of claim 16, wherein the preamplifier further comprises:
a second amplifier stage, having a second input coupled to the resistive read head element, and having an amplifier output;
a second output stage, coupled to the amplifier output of the second amplifier stage, for presenting a signal at a second preamplifier output corresponding to the amplifier output of the second amplifier stage; and
a second feedback element, coupled between the second output stage and the second input;
and wherein the programmable input impedance circuit further comprises:

a second transistor having a control terminal coupled to the second amplifier stage, and having a conduction path connected between the main controllable current source and a reference voltage level, and coupled on one side to the second input; and first and second current sources, the first current source connected in series with the conduction path of the first transistor and for conducting a current corresponding to the controllable current, and the second current source connected in series with the conduction path of the second transistor and for conducting a current corresponding to the controllable current.

18. The disk drive system of claim 17, wherein the first amplifier stage comprises:
a first amplifier transistor having a control terminal coupled to the first input, and having a conduction path;
a first load, connected in series with the conduction path of the first amplifier transistor;
a second amplifier transistor having a control terminal coupled to the second input, and having a conduction path;
a second load, connected in series with the conduction path of the second amplifier transistor;
a first tail current source, coupled to commonly connected first ends of the conduction paths of the first and second amplifier transistors, for conducting a fixed current; and
a first gm stage, having an input coupled to the amplifier output of the first amplifier stage, and having an output coupled to the control terminal of the second amplifier transistor;
wherein the amplifier output of the first amplifier stage is at a node between the first load and the first amplifier transistor;
wherein the control terminal of the first transistor of the programmable input impedance circuit is coupled to a node between the second load and the second amplifier transistor;
and wherein the second amplifier stage comprises:
a third amplifier transistor having a control terminal coupled to the second input, and having a conduction path;
a third load, connected in series with the conduction path of the third amplifier transistor;
a fourth amplifier transistor having a control terminal coupled to the second input, and having a conduction path;
a fourth load, connected in series with the conduction path of the fourth amplifier transistor;
a second tail current source, coupled to commonly connected first ends of the conduction paths of the third and fourth amplifier transistors, for conducting a fixed current; and
a second gm stage, having an input coupled to the amplifier output of the second amplifier stage, and having an output coupled to the control terminal of the fourth amplifier transistor;
wherein the amplifier output of the second amplifier stage is at a node between the third load and the third amplifier transistor;
and wherein the control terminal of the second transistor of the programmable input impedance circuit is coupled to a node between the fourth load and the fourth amplifier transistor.

19. The disk drive system of claim 18, wherein the first output stage comprises:

a first output transistor, having a control terminal coupled to the amplifier output of the first amplifier stage, and having a conduction path; and a first reference current source connected in series with the conduction path of the first output transistor;

wherein the first feedback element comprises:

a first feedback resistor connected on one side to the conduction path of the first output transistor at the first preamplifier output, and on another side to the first input;

wherein the second output stage comprises:

a second output transistor, having a control terminal coupled to the amplifier output of the second amplifier stage, and having a conduction path; and a second reference current source connected in series with the conduction path of the second output transistor;

and wherein the second feedback element comprises:

a second feedback resistor connected on one side to the conduction path of the second output transistor at the second preamplifier output, and on another side to the second input.

20. The disk drive system of claim 16, further comprising:

a preamplifier control circuit for controlling the controllable current conducted by the main controllable current source of the programmable input impedance circuit.

21. The disk drive system of claim 16, wherein the resistive read head element comprises a magnetoresistive element; and further comprising:

a head bias circuit for applying a DC bias to the magnetoresistive element.

22. A preamplifier circuit comprising:

first and second inputs associated with the preamplifier circuit;

a first feedback mechanism coupled between the first input and a first preamplifier output, the first feedback mechanism operative for varying a preamplifier input impedance associated with the input; and a second feedback mechanism coupled between the second input and a second preamplifier output, the second feedback mechanism operative for programmably varying the preamplifier input impedance.

23. The preamplifier circuit of claim 22 wherein the first feedback mechanism is differential and comprises an emitter follower and a resistor.

24. The preamplifier circuit of claim 22 further wherein the second feedback mechanism comprises a differential pair with an associated tail current.

25. The preamplifier circuit of claim 24, wherein the tale current varies a gain associated with an amplifier and varying the gain varies the preamplifier input impedance.

* * * * *